(12) United States Patent
Sadamatsu et al.

(10) Patent No.: US 8,132,145 B2
(45) Date of Patent: Mar. 6, 2012

(54) PRINTED CIRCUIT BOARD DESIGN SUPPORT METHOD AND APPARATUS

(75) Inventors: Toshisato Sadamatsu, Kawasaki (JP); Shinichi Hama, Fujisawa (JP); Shiro Kobayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 328 days.

(21) Appl. No.: 12/238,895

(22) Filed: Sep. 26, 2008

(65) Prior Publication Data

US 2009/0083687 A1 Mar. 26, 2009

(30) Foreign Application Priority Data

Sep. 26, 2007 (JP) ................................ 2007-249748

(51) Int. Cl.
*G06F 17/50* (2006.01)

(52) U.S. Cl. ........ 716/137; 716/126; 716/129; 716/130; 716/131; 716/132

(58) Field of Classification Search .................. 716/126, 716/129–132, 137
See application file for complete search history.

(56) References Cited

U.S. PATENT DOCUMENTS

| 5,847,968 | A | * | 12/1998 | Miura et al. | .................. 716/123 |
| 6,691,296 | B1 | * | 2/2004 | Nakayama et al. | ........... 716/122 |
| 6,937,480 | B2 | | 8/2005 | Iguchi et al. | |
| 7,047,628 | B2 | * | 5/2006 | Lee | ................................. 29/830 |
| 7,594,207 | B2 | * | 9/2009 | Mantik et al. | ................. 716/136 |
| 2008/0059934 | A1 | * | 3/2008 | Igeta | ............................... 716/13 |

FOREIGN PATENT DOCUMENTS

| JP | 2003-163467 | 6/2003 |
| JP | 2007-272342 | 10/2007 |

* cited by examiner

*Primary Examiner* — Nghia Doan
(74) *Attorney, Agent, or Firm* — Canon U.S.A., Inc. IP Division

(57) ABSTRACT

A method used for supporting designing of a printed circuit board including a plurality of conductive layers having conductive areas to which a constant potential is applied, includes specifying conductive areas having a predetermined wiring from the conductive areas for each of the plurality of conductive layers, extracting areas that overlap each other in a planar view from the specified conductive areas, specifying an interlayer connection member that electrically connects at least two of the plurality of conductive layers in the extracted area, and clearly specifying an area within a predetermined distance from a center of the specified interlayer connection member and in the extracted area.

8 Claims, 17 Drawing Sheets

PRINTED CIRCUIT BOARD DESIGN SUPPORT METHOD AND APPARATUS

BACKGROUND OF THE INVENTION

1. Field of the Invention

The present invention relates to a printed circuit board design method and apparatus, more specifically a method and apparatus for determining the arrangement of an interlayer connection member.

2. Description of the Related Art

In recent years, with the increasing speed of signal transmission in an electronic apparatus, there have been problems with unnecessary electromagnetic wave (radiation noise) emissions. In order to address such a problem, various designs for suppressing the radiation noise have been implemented in wiring of a printed circuit board in the electronic apparatus and a wiring harness connected to the wiring as well as an enclosure of the electronic apparatus.

As a design technique to suppress such radiation noise, Japanese Patent Application Laid-Open No. 2003-163467 and Japanese Patent Application Laid-Open No. 2007-272342 discuss a technique which devises ideas in arranging interlayer connection members (vias) used in electrically connecting a plurality of conductive layers in the printed circuit board. Japanese Patent Application Laid-Open No. 2003-163467 discusses a technique for calculating the number of vias arranged within a predetermined area of the printed circuit board and informing a user of the calculation result if the number of the arranged vias is smaller than a predetermined number. Further, Japanese Patent Application Laid-Open No. 2003-163467 discusses a technique for detecting whether the vias are arranged at a predetermined interval and informing a user of the detection result if the predetermined interval is not maintained.

Another design technique under development for suppressing the radiation noise is to shorten the length of a return current path of a high-speed signal current. Here, the return current refers to a feedback current of a signal. The return current flows in a power area or a ground (GND) area near a high-speed signal current. Japanese Patent Application Laid-Open No. 2003-163467 discusses a technique for supporting the arrangement of vias which can realize a shorter return current path near the power line wired on a ground layer. Further, Japanese Patent Application Laid-Open No. 2007-272342 discusses a technique to detect a checkpoint for determining whether a layer of a return current of a signal line needs to be changed and to display an area within a predetermined distance from the check point and where vias are not arranged.

According to the techniques discussed in Japanese Patent Application Laid-Open No. 2003-163467 and Japanese Patent Application Laid-Open No. 2007-272342, after the predetermined notification and the display of the area are performed, the user needs to make additional arrangement of the vias to satisfy requirements. At that time, the user is required to visually check and determine possible positions where the vias can be added. However, it takes considerable time to determine the position where vias can be additionally arranged. In addition, a possibility of error and oversight during the determination increases. Further, regarding the return current, the technique discussed in Japanese Patent Application Laid-Open No. 2003-163467 does not consider a return current path near high-speed interconnection vias.

SUMMARY OF THE INVENTION

An embodiment of the present invention is directed to a printed circuit board design support method and apparatus capable of simplifying determination of an area preferable for making additional arrangement of a via and shortening a path through which a return current flows near a high-speed signal via.

According to an aspect of the present invention, a method used for supporting designing of a printed circuit board including a plurality of conductive layers having conductive areas to which a constant potential is applied includes specifying conductive areas including wiring from the conductive areas for each of the plurality of conductive layers, extracting areas which overlap each other from the specified conductive areas, specifying an interlayer connection member that electrically connects at least two of the plurality of conductive layers in the extracted area, and specifying an area in the extracted areas and within a predetermined distance from the specified interlayer connection member.

According to another aspect of the present invention, since an area where an additional interlayer connection member can be desirably arranged is clearly specified, the user can quickly and easily arrange the additional interlayer connection member in an appropriate location.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

First Exemplary Embodiment

Figure 1:
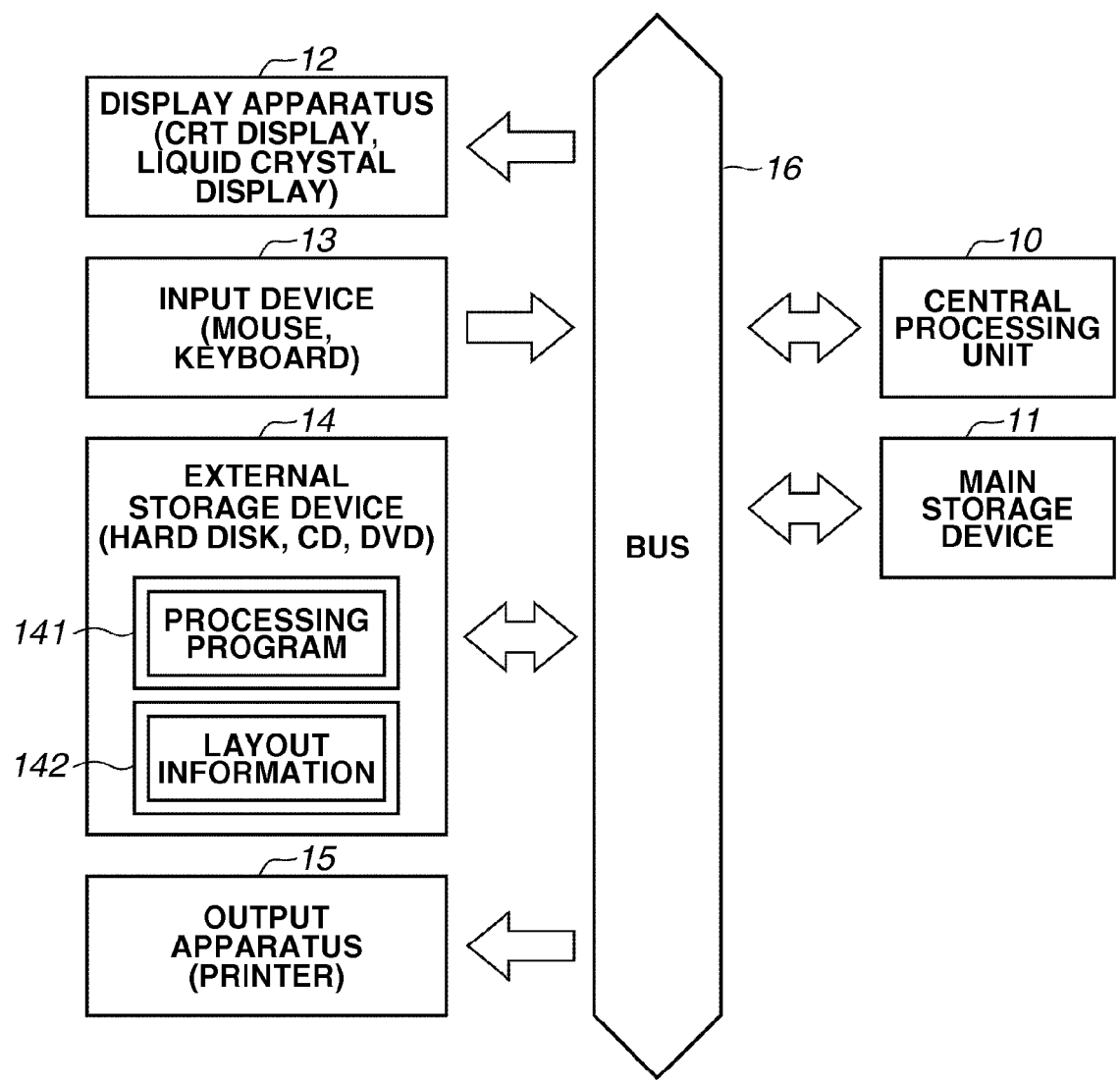
FIG. 1 illustrates a configuration of a printed circuit board design support apparatus according to an exemplary embodiment of the present invention.

FIG. 1 illustrates a configuration of a printed circuit board design support apparatus according to a first exemplary embodiment of the present invention. The printed circuit board design support apparatus includes a central processing unit (CPU) 10, a main storage device 11, a display apparatus 12, an input device 13, an external storage device 14, an output apparatus (printer) 15, and a bus 16.

The CPU 10 controls the entire printed circuit board design support apparatus. The main storage device 11 is a read-only storage device (read-only memory (ROM)) and/or a storage device (random access memory (RAM)), which the CPU 10 reads/writes during calculation processing. The display apparatus 12 is, for example, a cathode-ray tube display or a liquid crystal display. The input device 13 is, for example, a mouse and/or a keyboard. The external storage device 14 is used for reading data from and/or writing data to a recording medium such as a hard disk, a flexible disk, a compact disc (CD), a digital versatile disc (DVD), or a MiniDisc (MD). The output apparatus (printer) 15 is used for printing a calculation result output to the display apparatus 12.

The bus 16, which is used for transmission of information, includes an address bus, a data bus, and a control bus. The external storage device 14 stores, for example, processing program 141 and layout information 142 regarding the printed circuit board. The layout information 142 includes information such as layer configuration information about the printed circuit board, components information, and wiring information. The components information includes position coordinates of the components which are mounted on the printed circuit board and a shape and a size of a conductive portion to which the terminal is connected. The wiring information includes a name of a wiring between the components and position coordinates of each point that configures a wiring pattern.

The CPU 10, the main storage device 11, the display apparatus 12, the input device 13, the external storage device 14, and the output apparatus 15 are connected to one another via the bus 16. The CPU 10 controls exchange of control information and data information between apparatuses via the bus 16.

Figure 2:
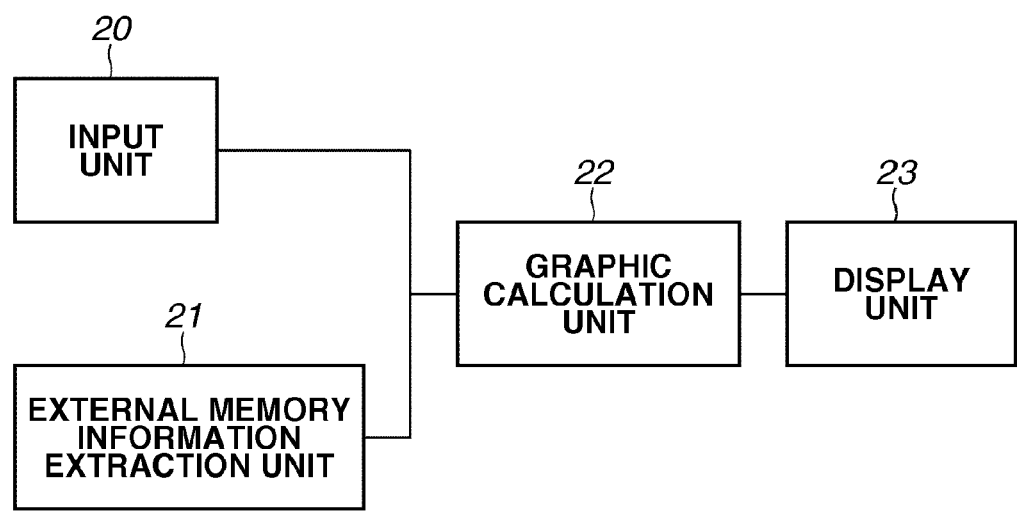
FIG. 2 is a block diagram illustrating a functional configuration of a printed circuit board design support apparatus according to an exemplary embodiment of the present invention.

FIG. 2 is a block diagram illustrating a functional configuration of the printed circuit board design support apparatus according to an exemplary embodiment of the present invention. An input unit 20, an external memory information extraction unit 21, a graphic calculation unit 22, and a display unit 23 are included in the functional configuration.

The input unit 20 is mainly configured by the input device 13. The input unit 20 sends an externally inputted instruction and condition to the CPU 10. The above instruction includes, for example, reading of the layout information 142 and execution of the processing program 141. The above condition includes, for example, conditions used in the execution of the processing program 141, which is hereinafter referred to as verification condition. The input information is either processed by the CPU 10 or stored in the main storage device 11 via the CPU 10.

The external memory information extraction unit 21 is mainly configured by the external storage device 14. When an execution command of the processing program 141 is input from the input unit 20, the CPU 10 controls the external memory information extraction unit 21 to extract the processing program 141, which is stored in the external storage device 14. The extracted processing program 141 is stored in the main storage device 11. Further, when an instruction to read the layout information is input from the input unit 20, the CPU 10 controls the external memory information extraction unit 21 to extract the layout information 142, which is stored in the external storage device 14. The extracted layout information is stored in the main storage device 11.

The graphic calculation unit 22 is mainly configured by the CPU 10 and the processing program 141 executed by the CPU 10. When a command to execute the processing program 141 is input from the input unit 20, the CPU 10 executes predetermined graphic calculation processing using a part of a storage area of the main storage device 11. The graphics calculation processing includes, for example, extraction of an area in which graphics overlap two-dimensionally with each other over a plurality of layers. The verification condition stored in the main storage device 11 and the layout information 142 are referred to when the graphics calculation processing is performed.

The display unit 23 is mainly configured by the display apparatus 12. The display unit 23 displays, for example, an entry screen for prompting a user to enter the verification condition or a result of processing performed by the graphic calculation unit 22. Further, the display unit 23 displays a layout of the printed circuit board when an instruction to read the layout information is input from the input unit 20.

Figure 3:
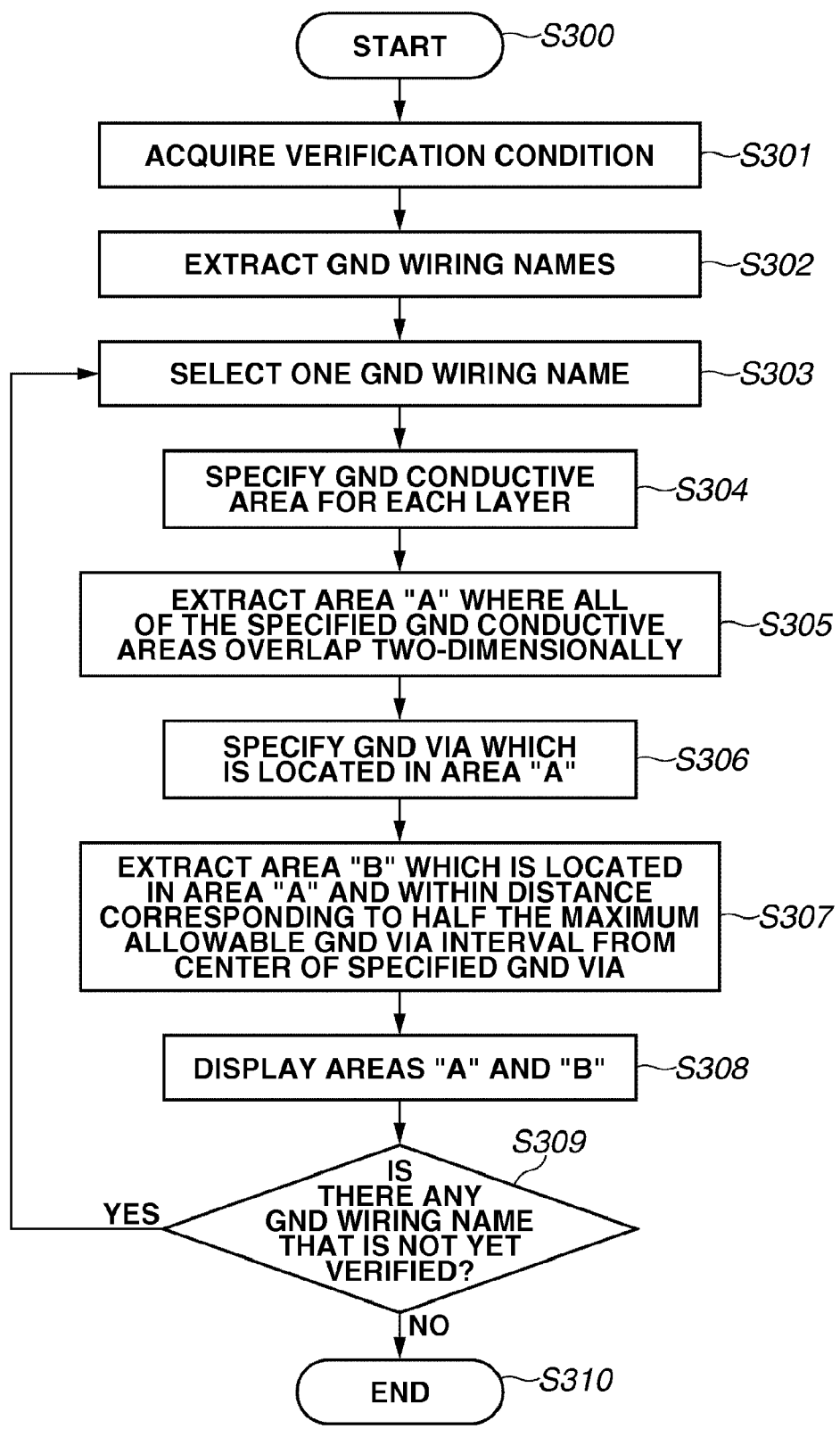
FIG. 3 is a flowchart illustrating operation of a printed circuit board design support apparatus according to a first exemplary embodiment of the present invention.

FIG. 3 is a flowchart illustrating operation of a printed circuit board design support apparatus according to a first exemplary embodiment of the present invention. Operations performed in designing a printed circuit board will be described referring to FIG. 3. The printed circuit board includes a plurality of conductive layers including GND conductive areas. The conductive layers are laminated with an insulating layer in between. Each of the GND conductive areas is connected through GND vias. GND potential, which is constant potential, is applied to each of the GND conductive areas. Further, a plurality of GND wirings are arranged on the printed circuit board. Each of the GND wirings is provided using one or more of the GND conductive areas.

When an instruction to execute the processing program 141 is input from the input unit 20, then in step S300, the external memory information extraction unit 21 extracts the processing program 141. The extracted processing program 141 is stored in the main storage device 11. The graphic calculation unit 22 executes the processing program 141 and the processing starts. The graphic calculation unit 22 specifies a GND wiring as a predetermined wiring to be processed. Alternatively, a power line can also be specified as a predetermined wiring, or when a series of processes is performed after a GND wiring is specified, a power line can be specified and similar processing can be performed.

In step S301, the display unit 23 displays an entry screen for the user to enter the verification condition. When the user enters the verification condition, the graphic calculation unit 22 acquires the entered verification condition from the input unit 20. As the verification condition, a maximum value L1, which is a maximum allowable interval between GND vias, is input. This maximum value L1 is hereinafter referred to as a maximum allowable GND via interval.

The maximum allowable GND via interval is desirably smaller than half ($\lambda/2$) a wavelength ($\lambda$) of a highest frequency signal current, which flows through the conductive area of the printed circuit board. The above maximum allowable GND via interval is determined so as to prevent a return current that flows through the GND or power conductive area on the printed circuit board, its reflected current, or a return current of a different signal, from resonating.

It is desirable that the GND vias or power vias are arranged within a distance of a $\lambda/2$ interval, in all directions, from one GND via or one power via. On the other hand, if the vias are arranged at an interval smaller than $\lambda/10$, radiation noise can be reduced to a sufficient degree. For example, if the highest frequency of a signal current which flows on the printed circuit board is 1 GHz, then the wavelength of the signal which flows on the printed circuit board will be approximately 15 cm. Thus, the maximum GND via interval will be smaller than one tenth of the wavelength, which is 1.5 cm. In a stricter sense, the wavelength $\lambda p$ of the signal flowing on the printed circuit board can be obtained by $\lambda p = c/(f \times \sqrt{(\epsilon r \mu r)})$ where frequency is f, dielectric constant is $\epsilon r$, magnetic permeability is $\mu r$, and speed of light is c. Thus, a wavelength obtained from this formula can also be used.

In step S302, the graphic calculation unit 22 extracts names of a plurality of GND wirings (GND wiring names) from the layout information 142. This is because the GND wiring is specified as a predetermined wiring.

In step S303, the graphic calculation unit 22 arbitrarily selects one GND wiring name to be verified from a plurality of extracted GND wiring names.

In step S304, the graphic calculation unit 22 specifies GND conductive areas of the GND wiring (predetermined wiring) to be verified for each conductive layer.

In step S305, the graphic calculation unit 22 extracts areas where all of the specified GND conductive areas two-dimensionally overlap with each other in the thickness direction as areas "A". The areas A are, in other words, areas where all of the specified GND conductive areas overlap with each other in a planar view.

In step S306, the graphic calculation unit 22 specifies GND vias located in the areas A.

In step S307, the graphic calculation unit 22 extracts areas "B" which are in the areas A and within a distance corresponding to half the maximum allowable GND via interval (L1×½) from the center of the GND via specified in step S306. The areas B are additional-GND-via unnecessary areas. Accordingly, the specified GND via defines areas where a GND via can be desirably arranged.

In step S308, the graphic calculation unit 22 instructs the display unit 23 to display areas A and B which are extracted in steps S305 and S307 respectively.

In step S309, the graphic calculation unit 22 checks the layout information 142 to determine whether a GND wiring name which is not yet selected for verification exists. In other words, the graphic calculation unit 22 determines whether all of the GND wirings are verified.

If a GND wiring name which is not yet selected exists (YES in step S309), then the process returns to step S303 and one GND wiring name is selected. If a GND wiring name which is not yet selected does not exist (NO in step S309), that is, verification of all the GND wirings is finished, then the process proceeds to step S310. In Step S310 the graphic calculation unit 22 ends the processing program 141.

If wiring names "GNDA" and "GNDB" are extracted in step S302 and processing of steps S304 to S308 only as to the "GNDA" is finished, then the process returns to step S303. In step S303, the graphic calculation unit 22 and the display unit 23 executes the processing of steps S304 to S308 of the unverified wiring "GNDB".

Next, processing where the above-described operation is applied to an example of the printed circuit board will be described. Each of FIGS. 4A to 4E illustrates a structure of a concrete example of the printed circuit board. As illustrated in FIG. 4E, the printed circuit board includes four laminated conductive layers 40, 41, 42, and 43 with an insulating layer 44 in between. Referring to FIGS. 4A to 4E, a via provided in each conductive layer is connected to a via provided at the same position in a neighboring conductive layer. Followings are descriptions about some vias illustrated in FIGS. 4A to 4E.

Figure 4A:
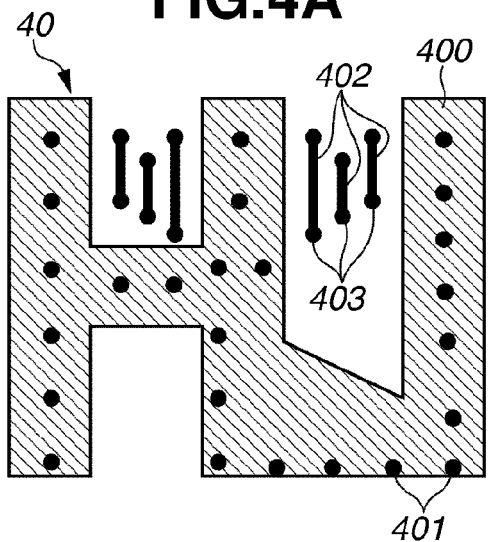
FIGS. 4A to 4E each illustrate a structure of examples of a printed circuit board.

As illustrated in FIG. 4A, a patterned GND conductive area 400 is included in the conductive layer 40 as a part of the GND wiring. A plurality of GND vias 401 is provided in a GND conductive area 400. The GND vias 401 electrically connect the conductive layer 40 to the conductive layer 41 and other conductive layers. Accordingly, the GND conductive area 400 is connected to GND conductive areas 410, 420 and 430 of the respective conductive layers 41, 42 and 43 via the GND vias 401. Further, a plurality of wirings 402 is arranged in a gap in the GND conductive area 400. At the end of each of the wirings 402, signal vias 403 are provided. The signal vias 403 mate with signal vias 423 of the conductive layer 42 and signal vias 433 of the conductive layer 43. Thus, the wirings 402 are connected to wirings 422 of the conductive layer 42 and wirings 432 of the conductive layer 43 via signal vias 403. The wirings 402 are signal wirings having an electric potential different from the power line or the GND line.

Figure 4B:
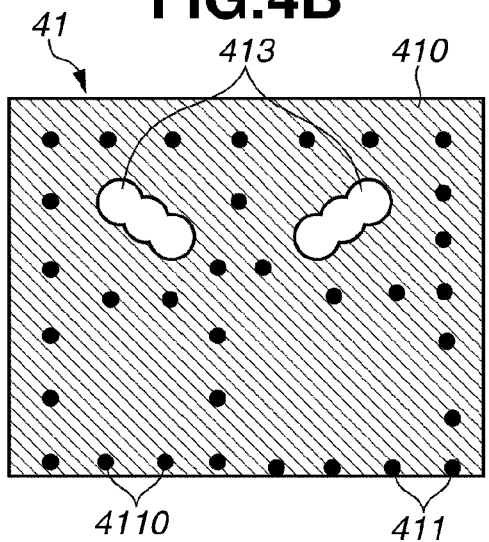

As illustrated in FIG. 4B, a patterned GND conductive area 410 including a plurality of GND vias is included in the conductive layer 41 as a part of the GND wiring. The GND vias electrically connect the conductive layer 41 to the conductive layer 40 and the conductive layer 42. For example, two GND vias 4110 are connected to two GND vias 4210 and electrically connect the conductive layer 41 to the conductive layer 42. Spatial areas 413 are also included in the conductive layer 41. The spatial areas 413 are gaps of the GND conductive area 410. The spatial areas 413 are not connected to a GND conductive area. The spatial areas 413 connect the signal via 403 and the signal via 423 across the conductive layer 41. Thus, the wirings 402 and the GND conductive area 410 of the conductive layer 41 are electrically isolated from each other.

Figure 4C:
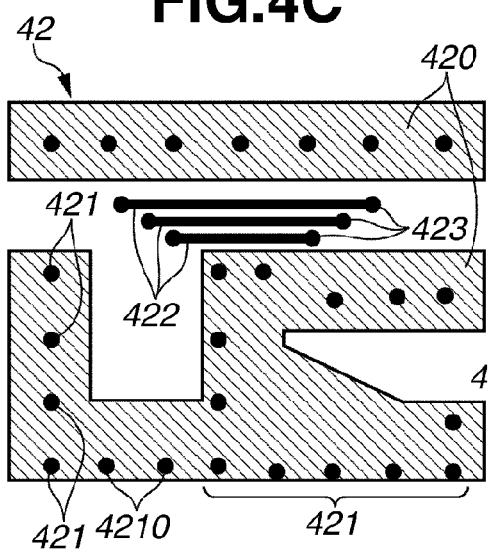

As illustrated in FIG. 4C, a patterned GND conductive area 420 including a plurality of GND vias is included in the conductive layer 42 as a part of the GND wiring. The GND vias electrically connect the conductive layer 42 to the conductive layer 41 and the conductive layer 43. For example, two GND vias 4210 are connected to GND vias 4110 and GND vias 4310. A plurality of wirings 422 are arranged in a gap in the GND conductive area 420. Each end of the wirings 422 is connected to each of signal vias 423. The wirings 422 are signal wirings having an electric potential different from the power line or the GND line.

Figure 4D:
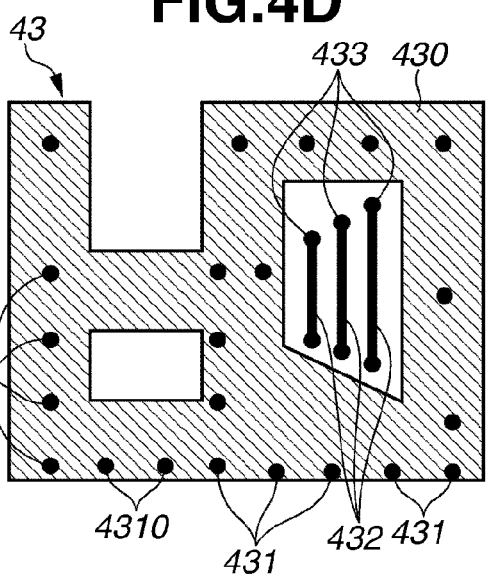
Figure 4E:
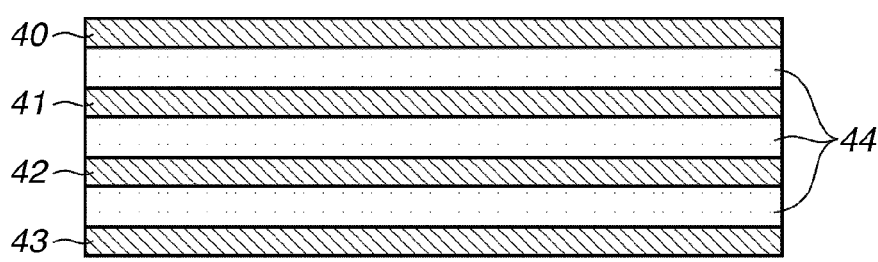

As illustrated in FIG. 4D, a patterned GND conductive area 430 is included in the conductive layer 43 as a part of the GND wiring. A plurality of GND vias 431 electrically connect the conductive layer 43 to the conductive layer 42. A plurality of wirings 432 are arranged in a gap in the GND conductive area 430. Each end of the wirings 432 is connected to each of signal vias 433. The signal vias 433 are connected to the signal vias 423. The wirings 432 are signal wirings having an electric potential different from the power line or the GND line.

The GND vias 401 are common to some of the GND vias 411. Some of the GND vias 411 are common to some of the GND vias 421. Some of the GND vias 421 are common to some of the GND vias 431. Further, some of the signal vias 403 are common to the signal vias 423. Some of the signal vias 423 are common to some of the signal vias 433. Further, the GND vias 4110, 4210, and 4310 are common in the conductive layers 41, 42, and 43. According to the GND vias 4110, 4210, and 4310, electrical continuity of the conductive layers 41 to 43 is ensured.

Further, each of the insulating layers 44, which are laminated between each of the conductive layers 40 to 43, are exposed in gaps in the GND conductive areas in the conductive layers 40 to 43 if a wiring or a via does not exist in those gaps. Further, the spatial areas 413 prevent the signal vias 403, 423, and 433 from contacting the GND conductive area 410.

Figure 6:
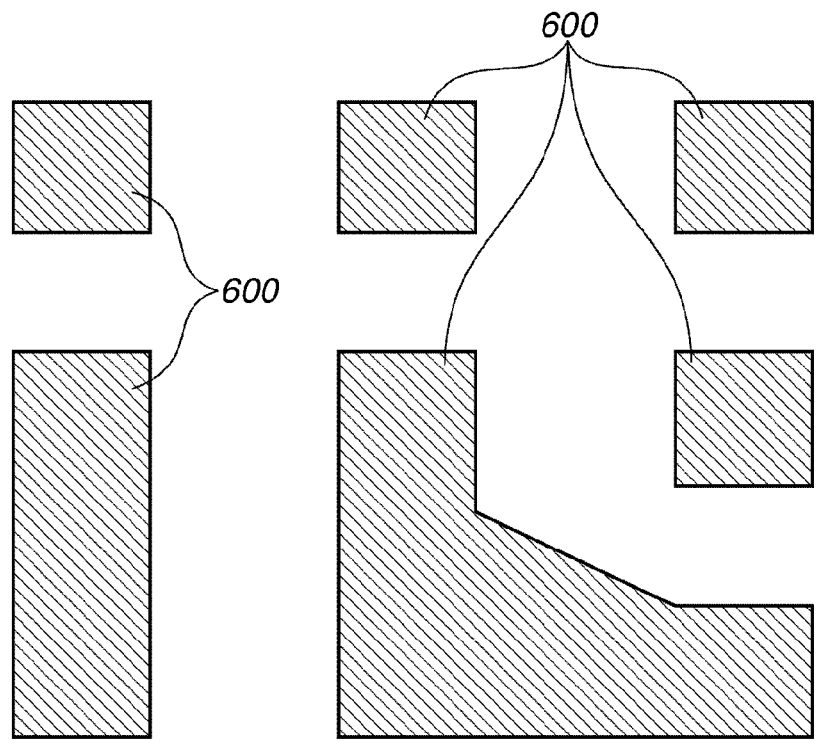
FIG. 6 illustrates information after step S305 according to the first exemplary embodiment of the present invention.
Figure 7:
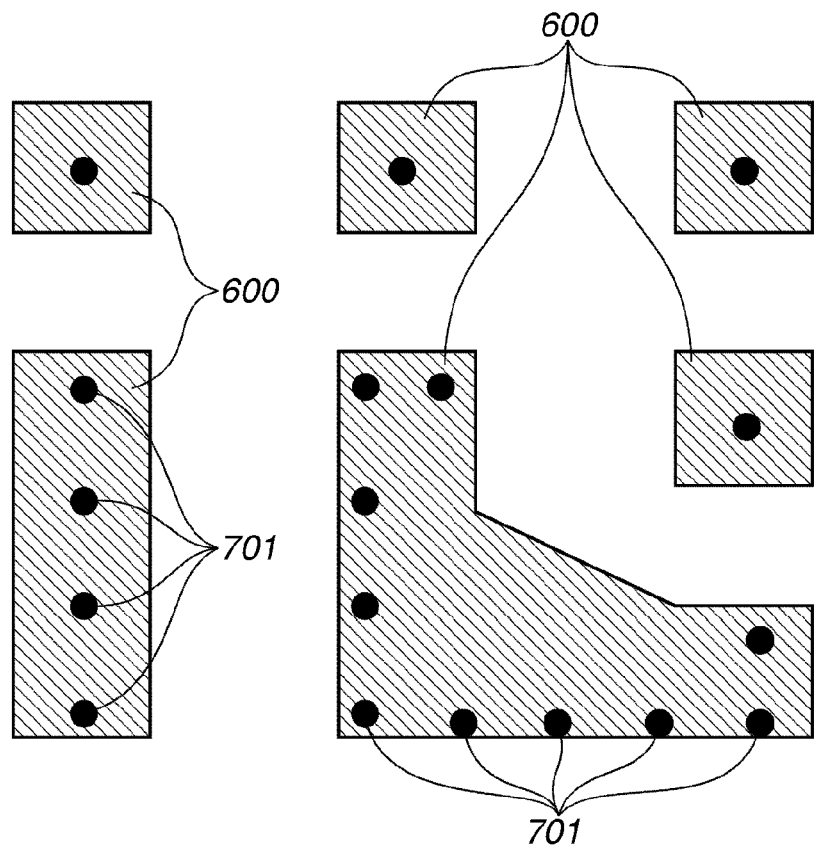
FIG. 7 illustrates information after step S306 according to the first exemplary embodiment of the present invention.
Figure 8:
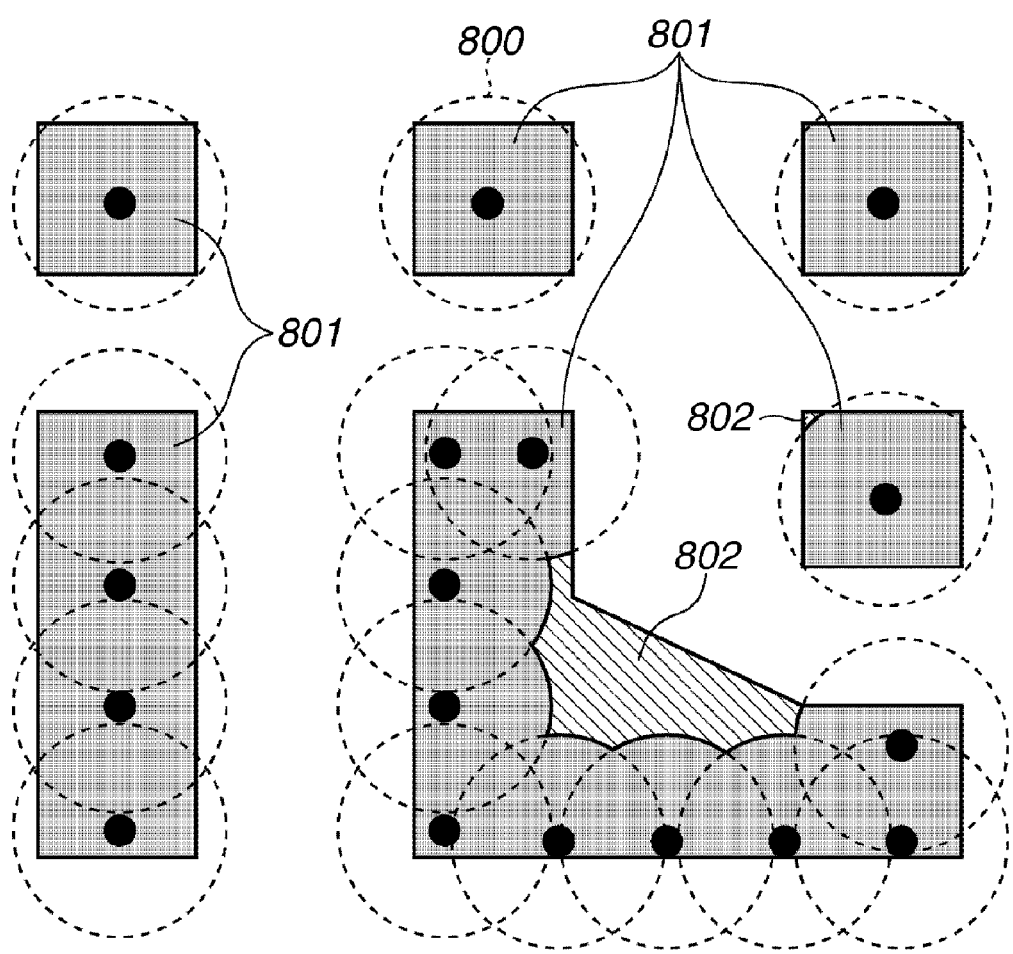
FIG. 8 illustrates information after step S307 according to the first exemplary embodiment of the present invention.

FIGS. 5A to 5D illustrate information after step S304 according to the first exemplary embodiment of the present invention. FIG. 6 illustrates information after step S305 according to the first exemplary embodiment of the present invention. FIG. 7 illustrates information after step S306 according to the first exemplary embodiment of the present invention. FIG. 8 illustrates information after step S307 according to the first exemplary embodiment of the present invention.

As described above, in step S303, the graphic calculation unit 22 selects one GND wiring name. Here, a name of a GND wiring which is included in the GND conductive areas 400, 410, 420, and 430 is selected. Next, in step S304, the graphic calculation unit 22 specifies the GND conductive area 400 (FIG. 5A), the GND conductive area 410 (FIG. 5B), the GND conductive area 420 (FIG. 5C), and the GND conductive area 430 (FIG. 5D).

In step S305, the graphic calculation unit 22 projects the GND conductive areas 400, 410, 420, and 430 illustrated in FIGS. 5A to 5D. Then, as illustrated in FIG. 6, the graphic calculation unit 22 extracts areas where all of the GND conductive areas in the conductive layers two-dimensionally overlap with each other as GND overlap conductive areas 600 (the areas A).

In step S306, as illustrated in FIG. 7, the graphic calculation unit 22 specifies areas which overlap with the GND overlap conductive areas 600 from the GND vias 401, 411, 421, 431, 4110, 4210, and 4310 as overlap GND vias 701.

In step S307, the graphic calculation unit 22 extracts areas within a distance corresponding to half the maximum allowable GND via interval from the center of each of the overlap GND vias 701 as the additional-GND-via unnecessary areas (the areas B). Thus, as illustrated in FIG. 8, logical sum of the GND overlap conductive areas 600 and areas included in circles 800 are extracted as additional-GND-via unnecessary areas 801. Each of the circles 800 has a radius of "L1×½" and has the center of each of the overlap GND vias 701 as its center (reference). Areas which are not included in the additional-GND-via unnecessary areas 801 in the GND overlap conductive areas 600 are determined as the additional-GND-via necessary areas 802.

In step S308, the graphic calculation unit 22 instructs the display unit 23 to display a result obtained from the calculation performed in step S307. According to this display, the GND overlap conductive areas 600 (the areas A) are desirably displayed to be distinguishable from the additional-GND-via unnecessary areas 801 (the areas B). Further, the additional-GND-via necessary areas 802 are desirably displayed to be distinguishable from the GND overlap conductive areas 600 (the areas A) and the additional-GND-via unnecessary areas 801 (the areas B). For example, a pattern or a color of the areas may be changed, or a division line can be displayed. Accordingly, the user can recognize the additional-GND-via necessary areas 802 at a glance.

When the display unit 23 displays the result obtained from the calculation, the graphic calculation unit 22 desirably instructs the display unit 23 to display an enter screen for the user to make an additional GND via arrangement to the additional-GND-via necessary areas 802. Accordingly, the user can recognize the additional-GND-via necessary areas 802 more easily, which reduces the possibility of failing to make additional GND via arrangement to the additional-GND-via necessary areas 802 due to oversight.

Further, the additional-GND-via necessary areas 802 can be displayed using a different color or a pattern depending on a level of importance. The importance can be determined according to, for example, area, circumference, or both of area and circumference of the additional-GND-via necessary areas 802. Further, the importance can be determined according to a width (distance from each configuration point in the additional-GND-via necessary areas 802 to a nearest point on the outer or inner edge of the area of the additional-GND-via necessary areas 802). The level of importance can be classified, for example, into three levels such as an area too small to arrange a GND via, an area where necessity of adding a GND via is not clear, and an area where one or more GND vias are necessary.

The level of importance can be classified when the user can recognize an area where a GND via can be arranged and an area where a GND via cannot be arranged. For example, if an additional-GND-via necessary area 802 is smaller than a conductive area arranged in a periphery of a GND via on each layer, then that additional-GND-via necessary area 802 is determined to be an area where a GND via cannot be added. If an additional-GND-via necessary area 802 is smaller than a circle having a diameter corresponding to the maximum allowable GND via interval or a square having a length corresponding to the maximum allowable GND via interval on a side, then that additional-GND-via necessary area 802 is determined as an area where necessity of the arrangement is not clear. Further, if an additional-GND-via necessary area 802 is larger than a circle having a diameter corresponding to the maximum allowable interval or a square having a length corresponding to the maximum allowable GND via interval on a side, then that additional-GND-via necessary area 802 is clearly determined to be an area where arrangement of one or more GND vias are necessary.

Figure 9:
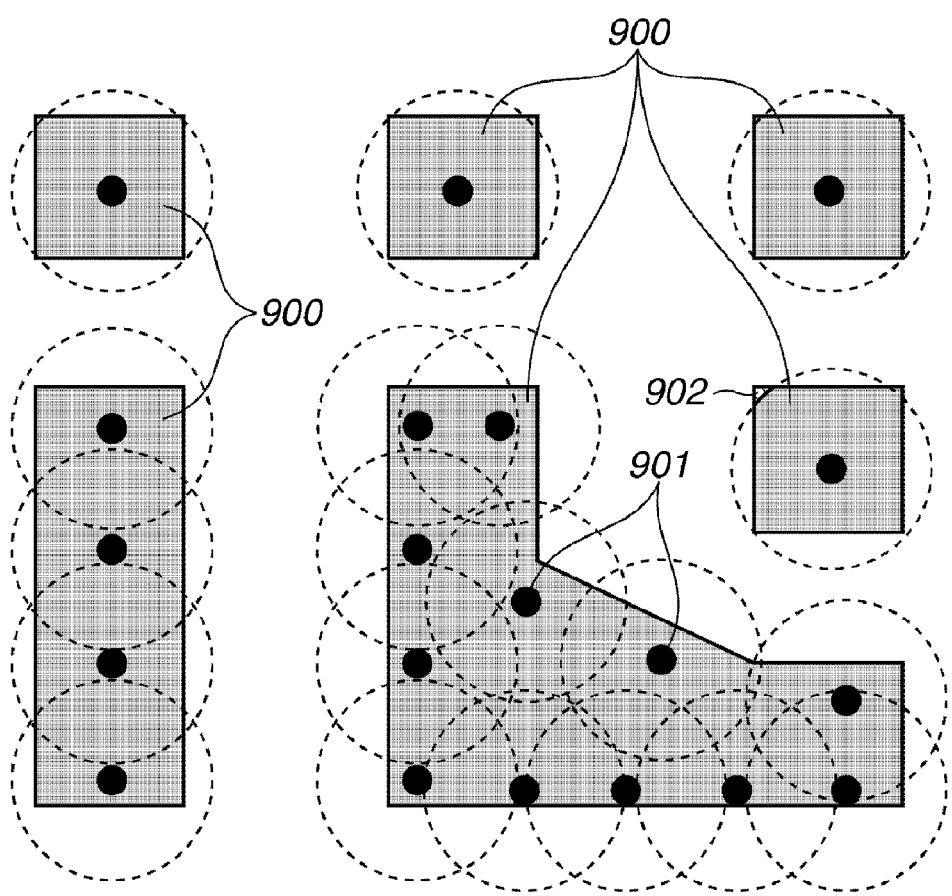
FIG. 9 illustrates a result of re-verification after a GND via is appropriately added according to the first exemplary embodiment of the present invention.

When the above-described entry screen is displayed, the user adds or moves a GND via to the additional-GND-via necessary areas 802 in the GND overlap conductive area 600. If re-verification is performed after the GND via is appropriately added to the additional-GND-via necessary areas 802, it can be verified that almost no additional-GND-via necessary area 902 is left after step S308. As illustrated in FIG. 9, the GND overlap conductive area 600 is substantially occupied by additional-GND-via unnecessary areas 900. In FIG. 9, two GND vias 901 are added to the additional-GND-via necessary areas 802.

It is to be noted that the GND vias are not necessarily added so that all of the additional-GND-via necessary areas 802 are changed into the additional-GND-via unnecessary areas 801. For example, if the additional-GND-via necessary area 902 is too small that an additional GND via cannot be added as illustrated in FIG. 9, then a GND via does not need to be added.

Further, the user does not necessarily add or move the GND via to the additional-GND-via necessary areas 802. The additional-GND-via necessary areas 802 can be deleted if it is in a permissible range from a viewpoint of prevention of radiation noise. By deleting the GND conductive areas, a space for correcting arrangements of components and wirings can be obtained. Further, by deleting a GND conductive area at an edge of the printed circuit board, the printed circuit board can be downsized.

As described above, if the additional-GND-via necessary areas 802 are displayed with a different color depending on the importance, the user can determine whether the addition is necessary according to the color. At that time, if the area where a GND via cannot be added is visualized, then the user can ignore that area. Further, if there is an area where necessity of the arrangement of a GND via is not clear, then the user can quickly proceed to confirming the shape of the GND overlap conductive area or a state of the wirings in the periphery of that area. Accordingly, workload of the user can be reduced.

According to the first exemplary embodiment, the user can easily recognize the additional-GND-via necessary areas 802 where addition of a GND via is desirable and where the GND via can be added. Thus, the user can add the GND via without taking time and without omission.

It is to be noted that not only the GND conductive areas but also power areas can be verified in a similar way. In step S307, an area within a predetermined distance corresponding to half the maximum allowable GND via interval from a specified GND via is extracted as the area B so that a area within a given circle is inevitably elected. However, a different area of a similar level can also be extracted. For example, an area of a rectangle, such as a square, whose diagonal cross (reference point) is arranged at a center of a GND via and whose side equals the maximum allowable interval, can also be extracted.

The area within a distance corresponding to the maximum allowable GND via interval from a GND via can be set as an additional-GND-via unnecessary area. For example, if the user enters a rate X (%) as the verification condition, then an area within a distance "L1×X/100" from the GND via can be determined as an additional-GND-via unnecessary area. As a result, the GND vias can be arranged at an interval that is equal to or shorter than L1.

Figure 10:
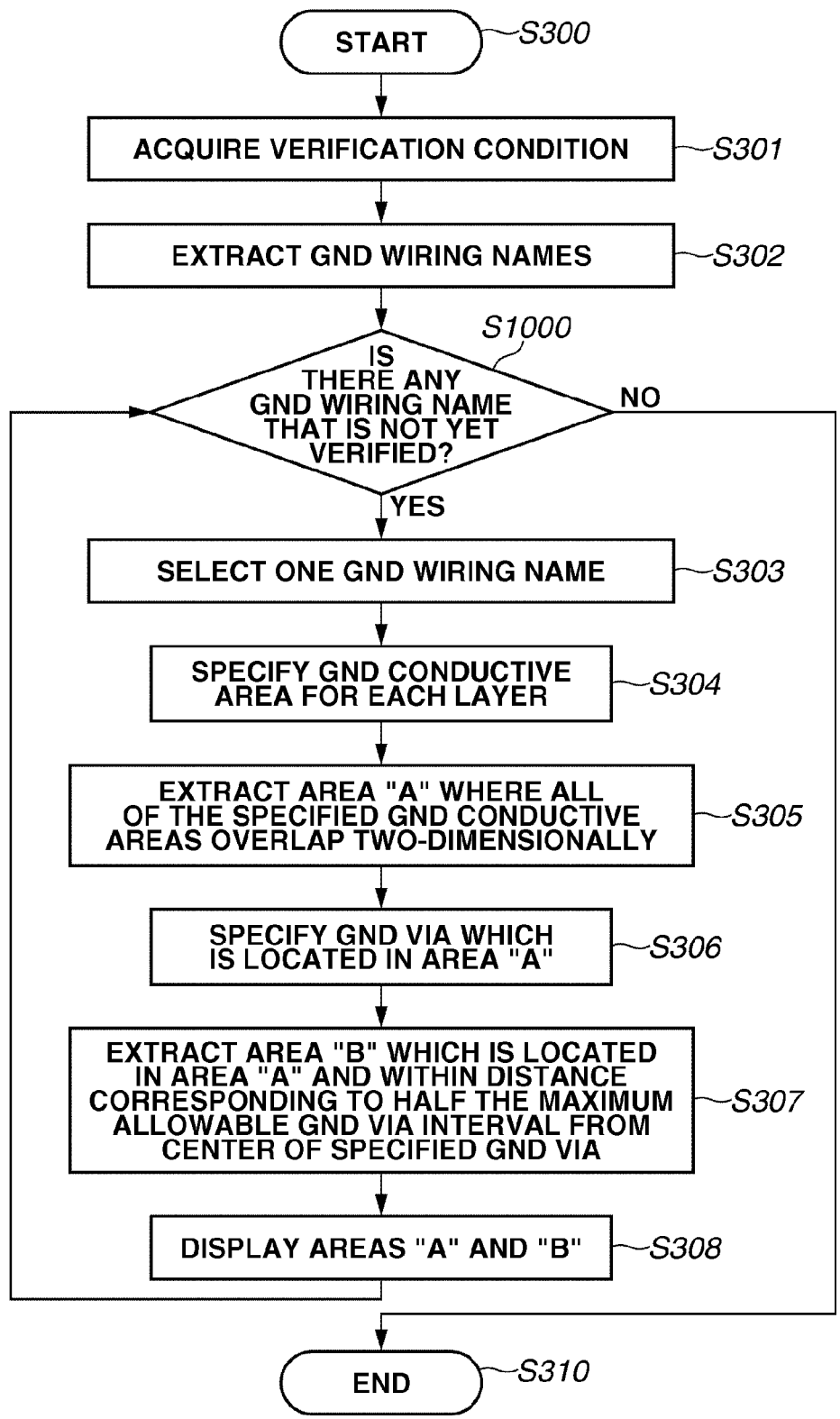
FIG. 10 is a flowchart illustrating a modified example of the first exemplary embodiment of the present invention.

According to the first exemplary embodiment, whether an unverified GND wiring name exists is determined in step S309 after the display of the areas A and B in step S308 is carried out. However, as illustrated in FIG. 10, whether an unverified GND wiring name exists can be determined in step S1000 before the selection of the GND wiring name in step S303.

In step S302, there may be a case where only one GND wiring name is extracted. In such a case, processes in steps S303 to S309 are performed only once. If the user realizes beforehand that only one GND wiring name exists, then the GND wiring which is a process target can be specified without acquiring the GND wiring name. Accordingly, in such a case, processes in steps S302, S303, and S309 can be omitted.

The printed circuit board design support apparatus can be configured so that the addition of the GND via is performed by the printed circuit board design support apparatus itself using the processing program 141 instead of the user.

Second Exemplary Embodiment

Figure 11:
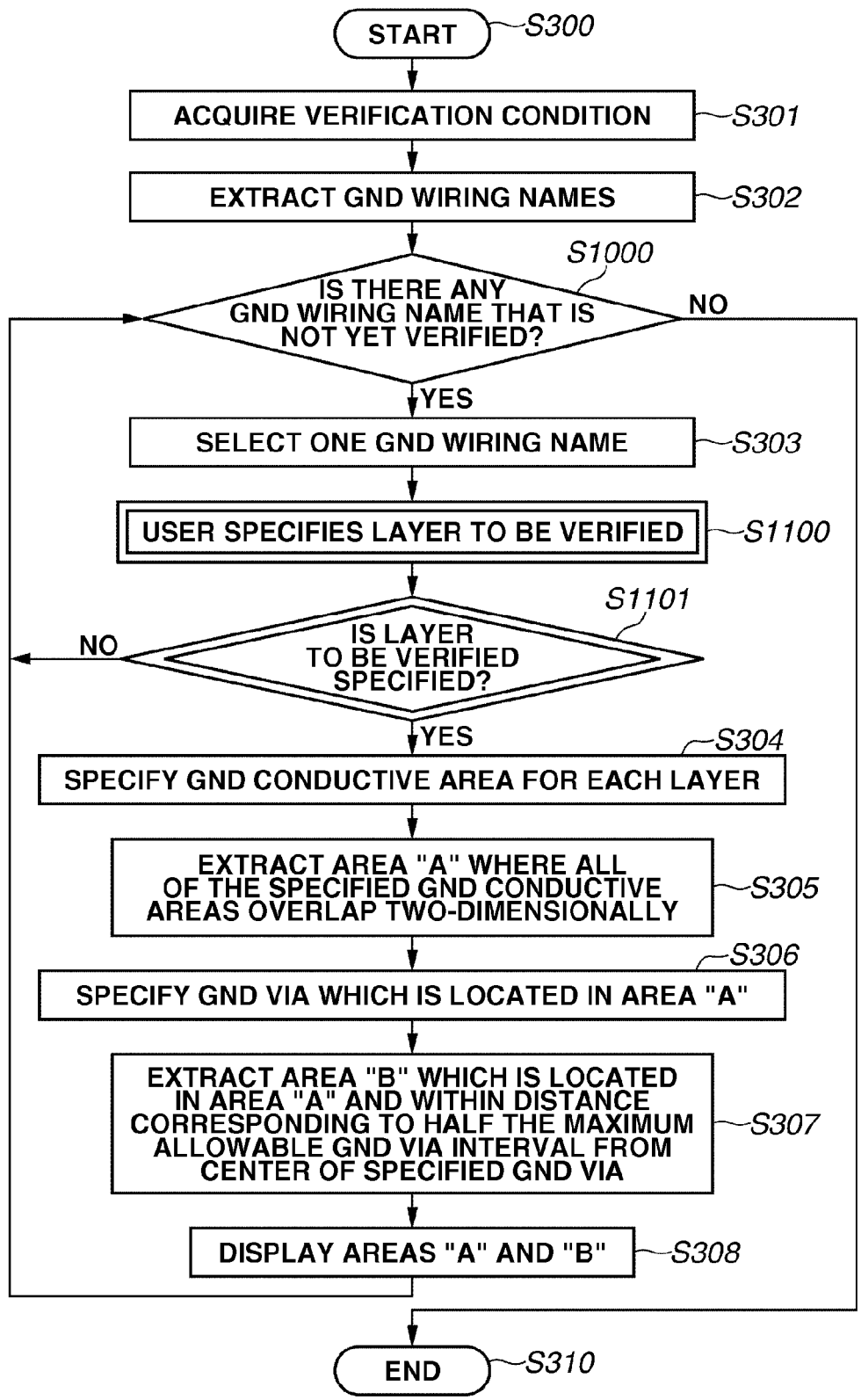
FIG. 11 is a flowchart illustrating an operation of a printed circuit board design support apparatus according to a second exemplary embodiment of the present invention.

A second exemplary embodiment of the present invention will be described. According to the first exemplary embodiment, all of the GND conductive areas of the extracted GND wirings are verified. According to the second exemplary embodiment, the GND conductive areas to be verified can be selected by the user. Although some parts of a processing program 141 of the second exemplary embodiment differs from the first exemplary embodiment, the rest is similar to the first exemplary embodiment. FIG. 11 is a flowchart illustrating an operation of a printed circuit board design support apparatus according to the second exemplary embodiment. Mainly, processes which differ from those illustrated in FIG. 10 are described.

First, the graphic calculation unit 22 performs the processes in steps S300 to S302 as in the first exemplary embodiment.

In step S1000, the graphic calculation unit 22 checks the layout information 142 and determines whether a GND wiring name which is not yet selected as a verification target exists. In other words, the graphic calculation unit 22 determines whether an unverified GND wiring is left.

If an unselected GND wiring name exists (YES in step S1000), then the process proceeds to step S303 and the graphic calculation unit 22 selects one GND wiring name. If an unselected GND wiring name does not exist (NO in step S1000), which means that verification of all the GND wirings is finished, then the process proceeds to step S310. In step S310, the graphic calculation unit 22 ends the processing program 141.

In step S303, the graphic calculation unit 22 arbitrarily extracts one GND wiring name from the extracted plurality of GND wiring names as a verification target.

In step S1100, the display unit 23 displays the selected GND wiring name as well as an entry screen for prompting the user to enter verification targets from the GND conductive areas of the selected GND wiring. The user then selects a plurality of conductive layers to be verified.

In step S1101, the graphic calculation unit 22 determines whether the user has entered the plurality of conductive layers. If the layers are not entered (NO in step S1101), then the process returns to step S1000. In step S1000, the graphic calculation unit 22 determines whether there is any GND wiring name that is not yet verified.

If the layers are entered by the user (YES in step S1101), then in step S304, the graphic calculation unit 22 specifies the GND conductive areas included in the plurality of conductive layers which are verified as the target layers. This means that the processing target is limited in the subsequent processes to the GND conductive areas in a limited conductive layers. Information about the conductive layers entered by the user is stored, for example, in the main storage device 11.

Next, the graphic calculation unit 22 executes the processes in steps S305 to S308 as in the first exemplary embodiment.

Figure 12:
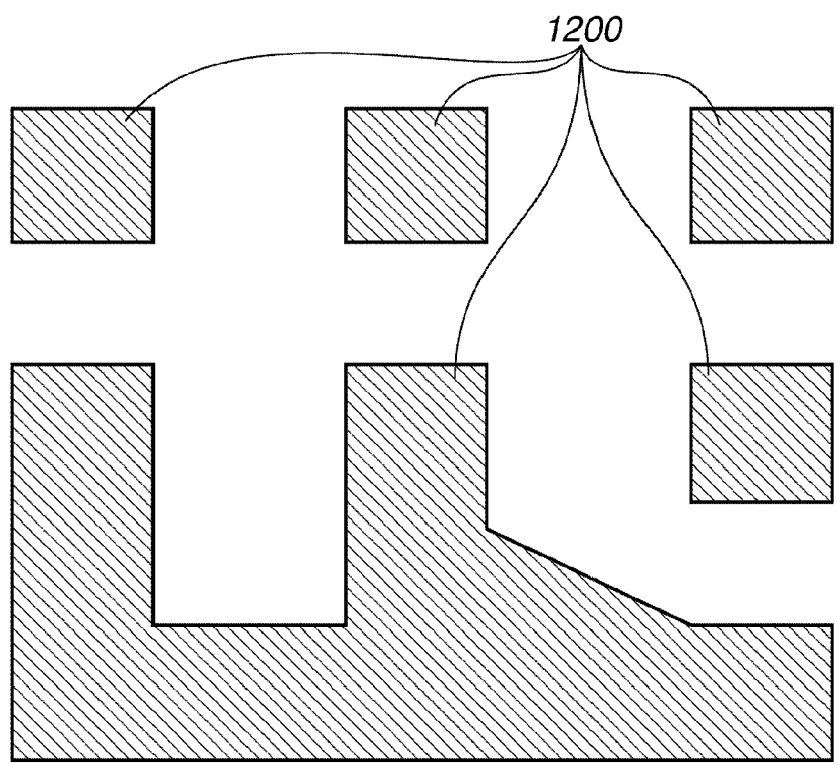
FIG. 12 illustrates information after step S305 according to the second exemplary embodiment of the present invention.
Figure 13:
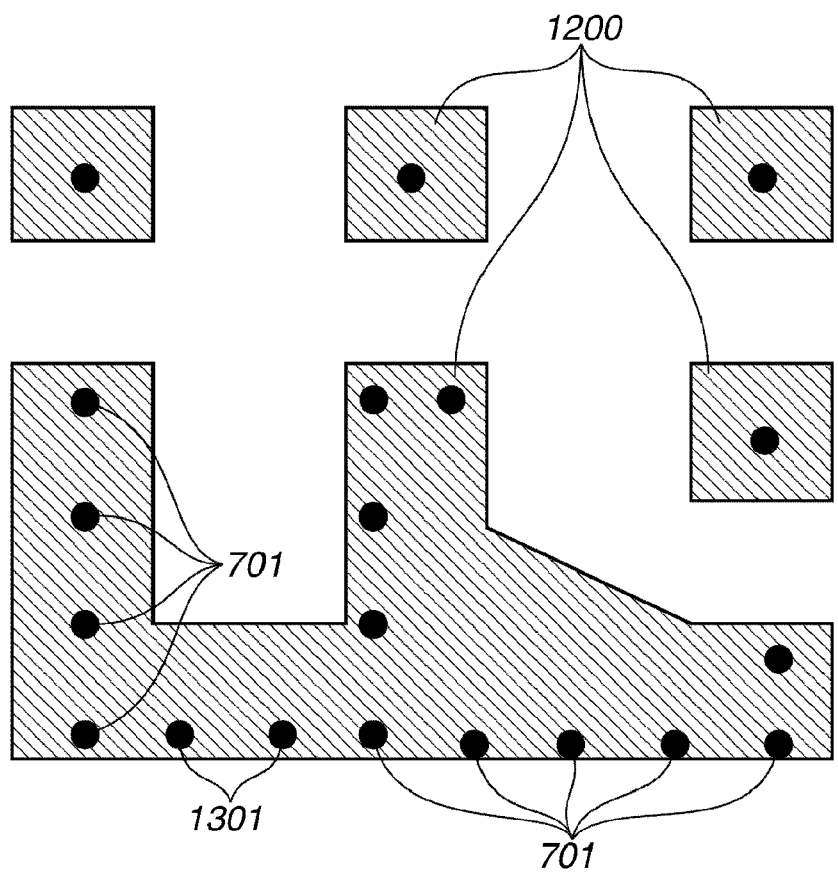
FIG. 13 illustrates information after step S306 according to the second exemplary embodiment of the present invention.
Figure 14:
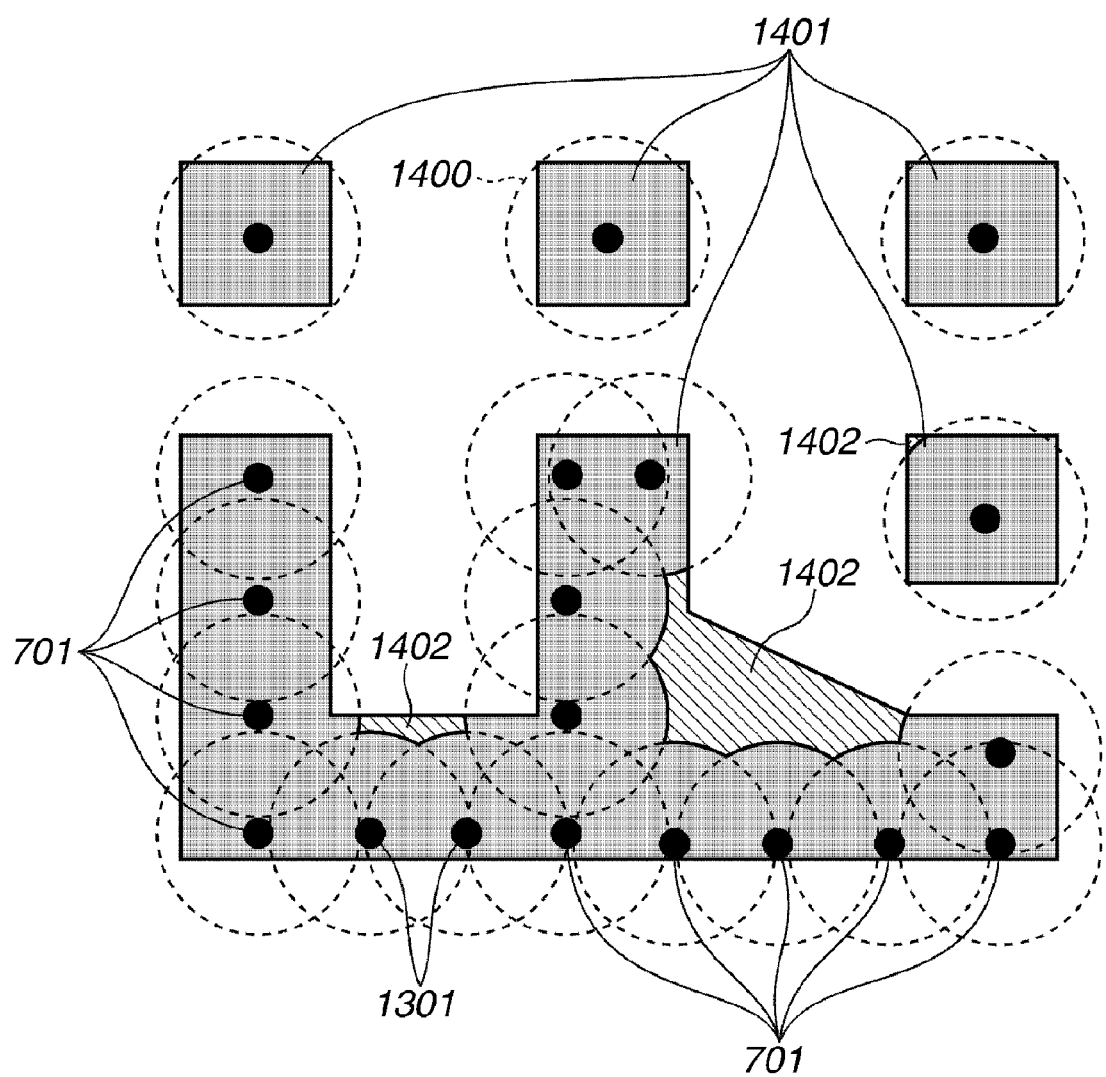
FIG. 14 illustrates information after step S307 according to the second exemplary embodiment of the present invention.

Next, the processing performed when the above-described operation is applied to an example of the printed circuit board illustrated in FIGS. 4A to 4E will be described. FIG. 12 illustrates information after step S305 according to the second exemplary embodiment of the present invention. FIG. 13 illustrates information after step S306 according to the second exemplary embodiment of the present invention. FIG. 14 illustrates information after step S307 according to the second exemplary embodiment of the present invention.

In step S303, the graphic calculation unit 22 selects a GND wiring name of the GND conductive areas 400, 410, 420, and 430. In step S1100, the user selects for example, the conductive layers 42 and 43 as the verification target layers. If the conductive layers 42 and 43 are selected as the verification target layers, in step S304, the graphic calculation unit 22 specifies the GND conductive areas 420 (FIG. 5C) and the GND conductive areas 430 (FIG. 5D).

Figure 5A:
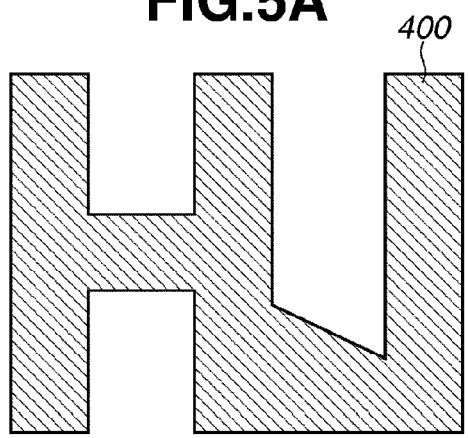
FIGS. 5A to 5D each illustrate information after step S304 according to the first exemplary embodiment of the present invention.
Figure 5B:
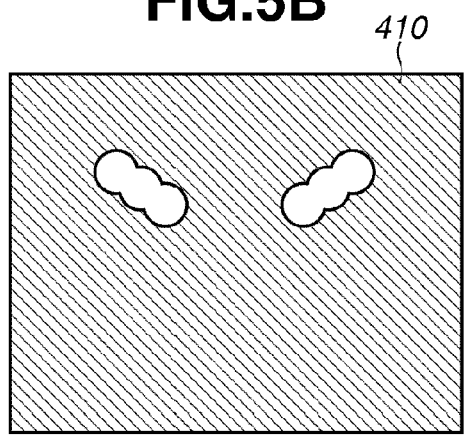
Figure 5C:
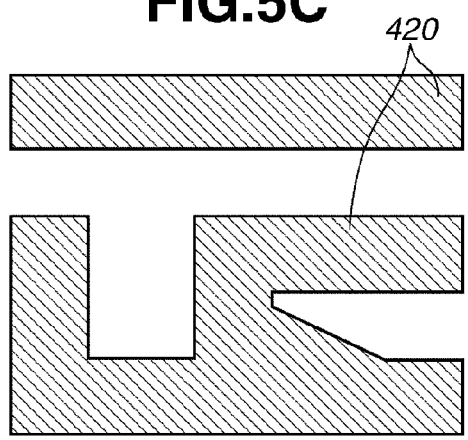
Figure 5D:
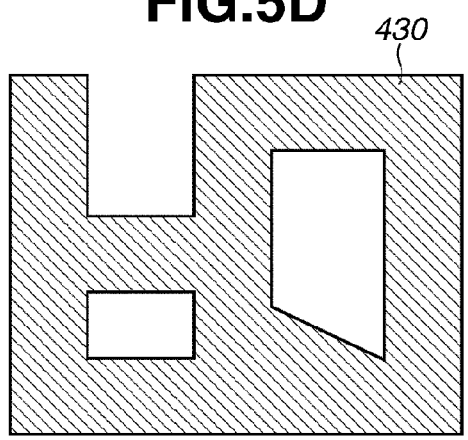

In step S305, the graphic calculation unit 22 projects the GND conductive areas 420 and 430 illustrated in FIGS. 5C and 5D. Then, as illustrated in FIG. 12, the graphic calculation unit 22 extracts areas where the GND conductive areas in the conductive layers 42 and 43 two-dimensionally overlap with each other, as the GND overlap conductive areas 1200 (the areas A).

In step S306, as illustrated in FIG. 13, the graphic calculation unit 22 specifies GND vias which overlap with the GND overlap conductive areas 1200 from the GND vias 421, 431, 4210, and 4310 as overlap GND vias 701 and 1301.

In step S307, the graphic calculation unit 22 extracts an area within a distance corresponding to half the maximum allowable GND via interval from the center of each of the overlap GND vias 701 or 1301 in the GND overlap conductive areas 1200 as the additional-GND-via unnecessary areas (the areas B). Thus, as illustrated in FIG. 14, a logical sum of the areas within circles 1400 are extracted as additional-GND-via unnecessary areas 1401. The circles 1400 have a radius of "L1×½". The center of the circles 1400 is a center of the overlap GND vias 701 or 1301. Areas which are not included in the additional-GND-via unnecessary areas 1401 in the GND overlap conductive areas 1200 are determined as additional-GND-via necessary areas 1402 to which additional GND vias can be added.

In step S308, the graphic calculation unit 22 instructs the display unit 23 to display a result obtained from the calculation performed in step S307. The GND overlap conductive areas 1200 (the areas A) can be displayed to be distinguishable from the additional-GND-via unnecessary areas 1401 (the areas B). Further, the additional-GND-via necessary areas 1402 can be displayed to be distinguishable from the GND overlap conductive areas 1200 (the areas A) and the additional-GND-via unnecessary areas 1401 (the areas B). For example, a pattern or a color of the areas can be changed, or a division line can be displayed. Further, similar to the first exemplary embodiment, the additional-GND-via necessary areas 1402 can be displayed using a different color or a pattern depending on the level of importance.

Figure 15:
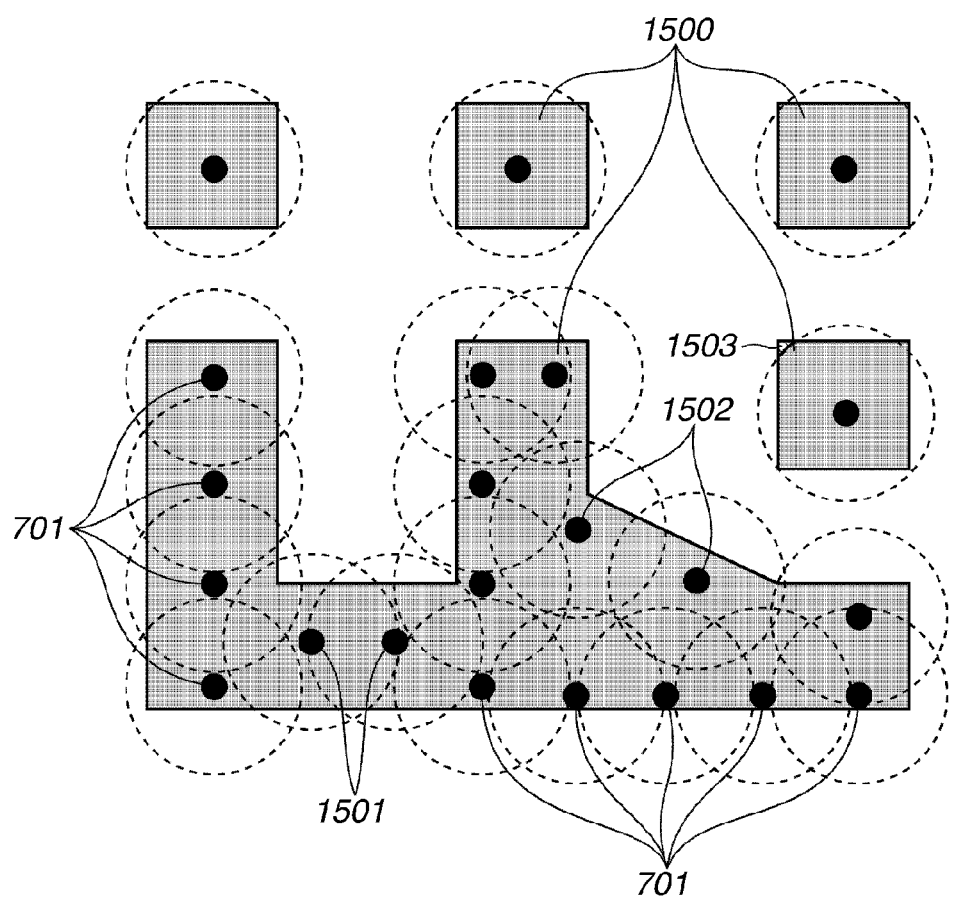
FIG. 15 illustrates a result of re-verification when a GND via is appropriately added according to the second exemplary embodiment of the present invention.

When the above-described screen is displayed, the user adds or moves a GND via to the additional-GND-via necessary areas 1402 in the GND overlap conductive area 1200 or move a GND via included in the GND overlap conductive area 1200 to the additional-GND-via necessary areas 1402. If re-verification is performed after the GND via is appropriately arranged in the additional-GND-via necessary areas 1402, it is determined that an additional-GND-via necessary areas 1402 substantially does not exist after the process in step S308. As illustrated in FIG. 15, the GND overlap conductive areas 1200 are substantially changed to additional-GND-via unnecessary areas 1500. In FIG. 15, two GND vias 1502 are added to an additional-GND-via necessary area 1402 and two overlap GND vias 1301 are moved to the location of GND vias 1501.

It is to be noted that the GND vias are not necessarily added or moved so that all of the additional-GND-via necessary areas 1402 are changed to additional-GND-via unnecessary areas 1401. For example, if the additional-GND-via necessary area 1503 is too small that an additional GND via cannot be added as illustrated in FIG. 15, then a GND via is not added.

Further, similar to the first exemplary embodiment, the user does not necessarily add or move the GND via to the additional-GND-via necessary areas 1402. A portion of the GND conductive areas can be deleted in a permissible range to prevent radiation noise.

According to the second exemplary embodiment, the user can easily recognize the additional-GND-via necessary areas 1402 where GND vias which only go through a part of a plurality of conductive layers can be added, and thus the GND vias can be added without taking time and without omission. According to the first exemplary embodiment, GND vias that go through all the conductive layers are the target GND vias. However, according to the second exemplary embodiment, the user is able to recognize the areas where the GND vias can be desirably added even if the vias go through not all the conductive layers.

According to the process in step S1100, the graphic calculation unit 22 can extract information about the setting of the verification target layers from the external memory information extraction unit 21. This information is input by the user through the input unit 20 in advance and stored in the external memory information extraction unit 21.

Third Exemplary Embodiment

Figure 16:
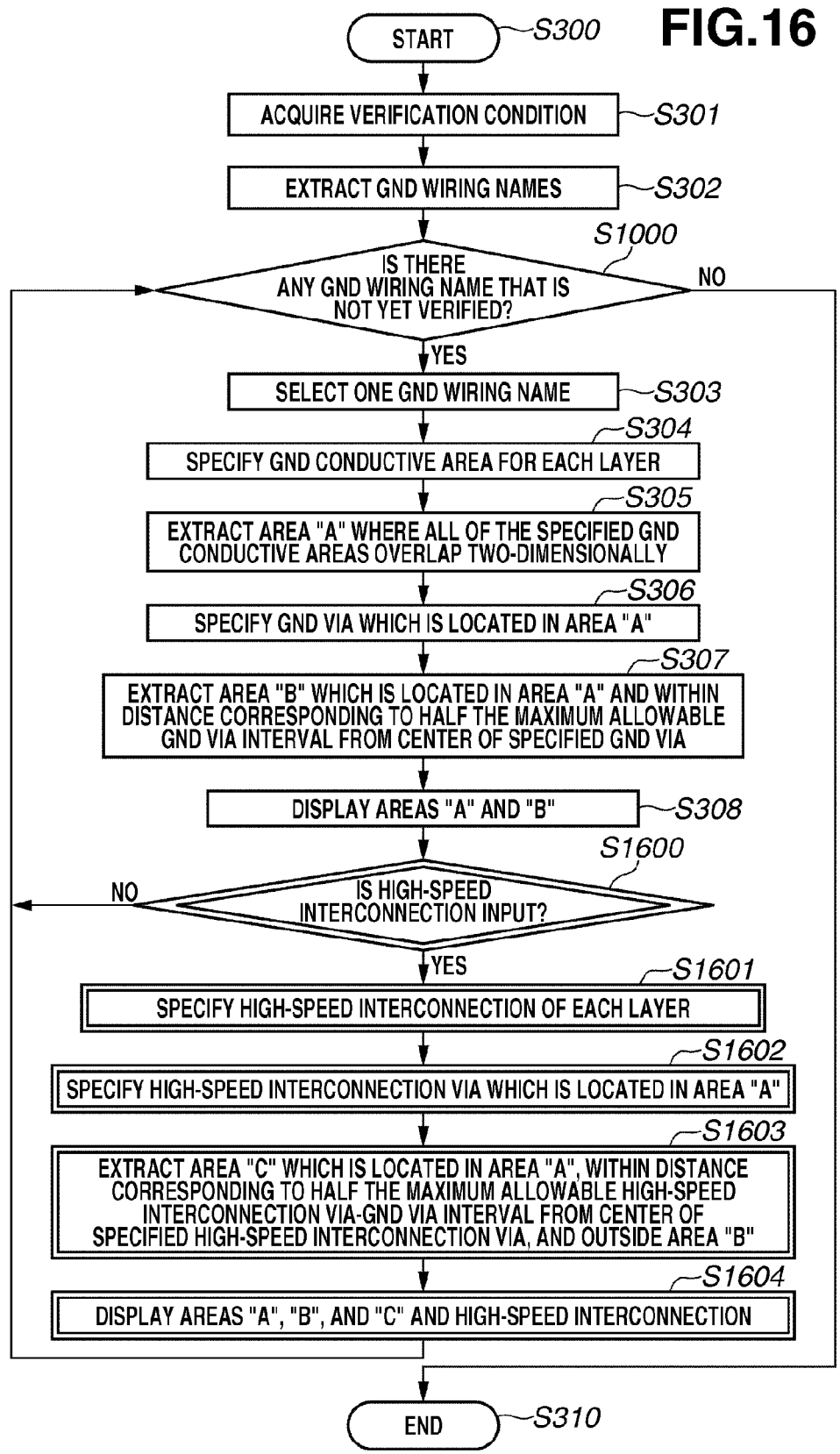
FIG. 16 is a flowchart illustrating an operation of a printed circuit board design support apparatus according to a third exemplary embodiment of the present invention.

A third exemplary embodiment of the present invention will be described. According to the third exemplary embodiment, a design considering high-speed interconnection as well as the GND wirings becomes possible. Although some of a processing program 141 of the third exemplary embodiment differs from the first exemplary embodiment, the rest is similar to the first exemplary embodiment. FIG. 16 is a flowchart illustrating an operation of a printed circuit board design support apparatus according to the third exemplary embodiment. Mainly, processes which differ from those illustrated in FIG. 10 are described.

After the process is started in step S300, the display unit 23 displays an entry screen for prompting a user to enter a verification condition. In step S301, the graphic calculation unit 22 acquires the verification condition input through the input unit 20. As the verification condition, a maximum allowable high-speed interconnection via-GND via interval L2 as well as the maximum allowable GND via interval L1 are input.

Similar to the first exemplary embodiment, a value smaller than one tenth of a wavelength (λ) of a highest speed signal current that flows on the printed circuit board can be used as the maximum allowable interval L1. It is desirable to make arrangement of a GND via considering high-speed interconnection so that a path of a return current becomes shorter. Accordingly, it is desirable to arrange the GND via as close as possible to the high-speed interconnection via. It is sufficient if the interval between the high-speed interconnection via and the GND via is arranged in a range smaller than λ/10.

At that time, the maximum allowable high-speed interconnection via-GND via interval L2 which is calculated based on a frequency or a wavelength of a signal current that flows through the high-speed interconnection is acquired. The maximum allowable high-speed interconnection via-GND via interval L2 can also be directly acquired for each high-speed interconnection as a verification condition. Further, a same value can be used for the maximum allowable interval L1 and the maximum allowable high-speed interconnection via-GND via interval L2. In this case, the user does not need to input the frequency or the wavelength of the signal current that flows through each high-speed interconnection or the maximum allowable high-speed interconnection via-GND via interval L2.

After step S300, the graphic calculation unit 22 and the display unit 23 perform the processes in steps S302 to S308 as performed in the first exemplary embodiment.

After step S308, the process proceeds to step S1600. In step S1600, the graphic calculation unit 22 determines whether a high-speed interconnection is input as a predetermined signal line. The high-speed interconnection is input, for example, by the user in advance through the input unit 20. In this case, the input information is, for example, stored in the external memory information extraction unit 21.

Each time the graphic calculation unit 22 checks whether a high-speed interconnection is input in step S1600, the graphic calculation unit 22 can control the display unit 23 to display an entry screen asking the user to enter a high-speed interconnection. The information entered by the user is, for example, stored in the main storage device 11. In this case, the graphic calculation unit 22 determines whether the high-speed interconnection exists based on information concerning high-speed interconnection stored in the external memory information extraction unit 21 or the main storage device 11.

If the high-speed interconnection is entered (YES in step S1600), then the process proceeds to step S1601. If the high-speed interconnection is not yet entered (NO in step S1600), then the process returns to step S1000.

In step S1601, the graphic calculation unit 22 specifies the entered high-speed interconnection from each conductive layer.

In step S1602, the graphic calculation unit 22 specifies high-speed interconnection vias which go through and are connected to each conductive layer from the specified high-speed interconnection vias.

In step S1603, the graphic calculation unit 22 extracts an area which is within the areas A but not in the areas B, and within a distance corresponding to half the maximum allowable high-speed interconnection via-GND via interval L2 from the center of the high-speed interconnection vias specified in step S1602 as an additional-GND-via priority area "C". Thus, an area where arrangement of an additional GND via is necessary becomes clear based on the specified high-speed interconnection vias. In other words, an area to which priority is given in making additional arrangement of a GND via in the additional-GND-via necessary areas 802 becomes clear.

In step S1604, the graphic calculation unit 22 instructs the display unit 23 to display the areas A and B, the high-speed interconnection, and the area C which are extracted in steps S305, S307, S1601, and S1603.

Figure 17:
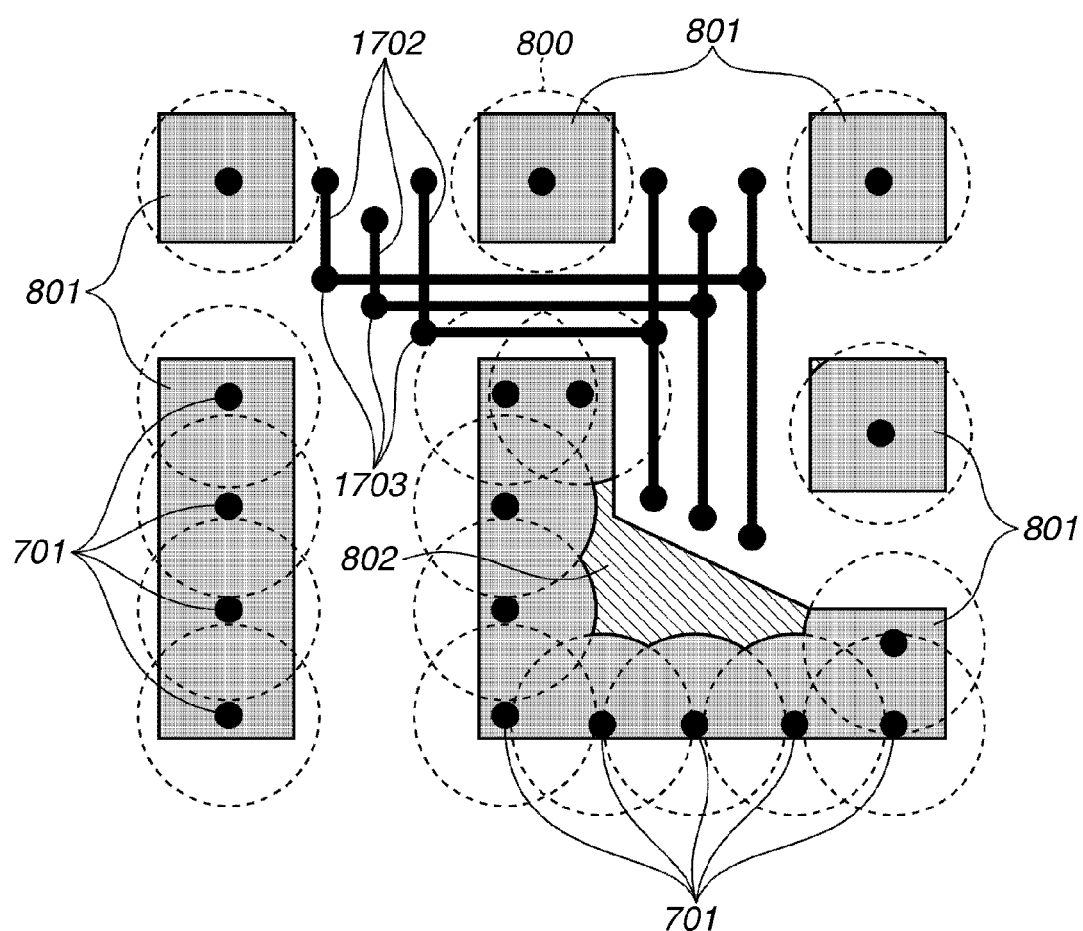
FIG. 17 illustrates information after step S1602 according to the third exemplary embodiment of the present invention.
Figure 18:
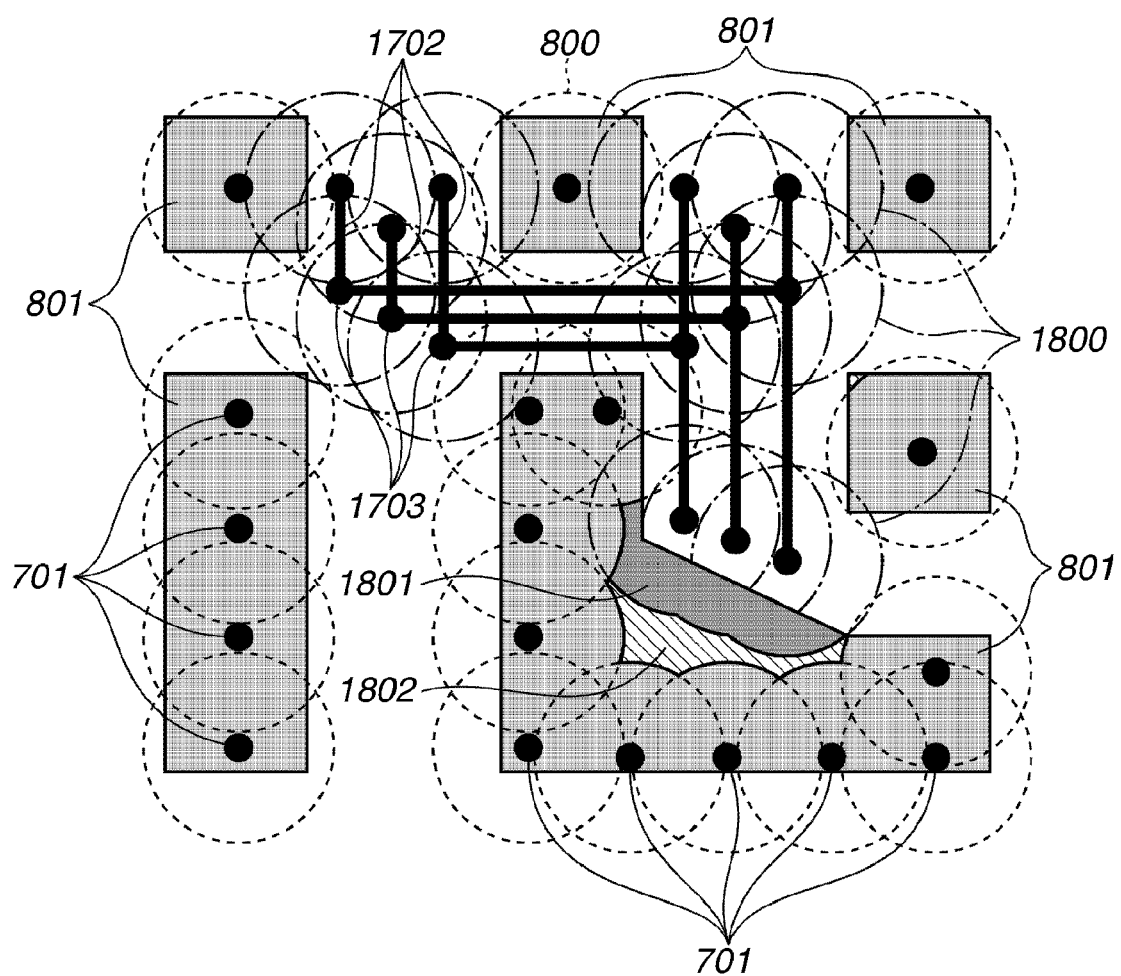
FIG. 18 illustrates information after step S1603 according to the third exemplary embodiment of the present invention.

Next, processing performed in a case where the above-described operation is applied to an example of the printed circuit board illustrated in FIGS. 4A to 4E will be described. FIG. 17 illustrates information after step S1602 according to the third exemplary embodiment of the present invention. FIG. 18 illustrates information after step S1603 according to the third exemplary embodiment of the present invention.

Here, information about the wirings 402, 422 and 423 are input as information about high-speed interconnection in step S301. In this case, in step S1601, the wirings 402, 422 and 423 are specified from each conductive layer.

In step S1602, the graphic calculation unit 22 specifies vias 1703 which go through the conductive layers 40, 41, 42, and 43 and which two-dimensionally overlap with each other from the high-speed interconnection vias 403, 423 and 433 as well as the interconnections 1702 to which the vias 1703 are connected.

In step S1603, the graphic calculation unit 22 extracts the additional-GND-via priority area C which is the area in the additional-GND-via necessary areas 802 and further within a distance corresponding to half the maximum allowable high-speed interconnection via-GND via interval from the center of the high-speed interconnection vias. Thus, as illustrated in FIG. 18, logical sum of the areas within circles 1800 is extracted as an additional-GND-via priority area 1801. The circles 1800 have a radius of "L2×½". The center of the circles 1800 is a center of the vias 1703. Areas which are not included in the additional-GND-via priority area 1801 but in the additional-GND-via necessary area 802 are determined as an additional-GND-via necessary area having a lower priority. It is to be noted that the maximum allowable high-speed interconnection via-GND via interval L2 is desirably the same as the maximum allowable GND via interval L1.

In step S1604, the graphic calculation unit 22 instructs the display unit 23 to display a result obtained from the calculation performed in step S1603. The GND overlap conductive areas 600 (the areas A), the additional-GND-via unnecessary areas 801 (the areas B) as well as the additional-GND-via priority area 1801 (area C) can be displayed to be distinguishable from each other. Further, the additional-GND-via necessary area 1802 can be displayed to be distinguishable from the areas A, B, and C. For example, a pattern or a color of the areas can be changed, or a division line can be displayed.

In this way, the user can not only recognize the additional-GND-via necessary areas 1802 but can easily recognize the additional-GND-via priority area 1801. Further, the graphic calculation unit 22 desirably instructs the display unit 23 to display an entry screen prompting a user to make an additional arrangement of a GND via to the additional-GND-via priority area 1801. Accordingly, the user can recognize the additional-GND-via priority area 1801 more easily, which helps the user add a GND via to the additional-GND-via priority area 1801 without omission.

Further, similar to the first exemplary embodiment, the additional-GND-via necessary area 1802 and the additional-GND-via priority area 1801 can be displayed using a different color or a pattern depending on the level of importance.

Further, the graphic calculation unit 22 can detect that the GND overlap conductive areas 600 do not exist in an area within a distance corresponding to the maximum allowable high-speed interconnection via-GND via interval L2 from each high speed interconnection via and instructs the display unit 23 to display the high-speed interconnection vias to be distinguishable from each other. In displaying the high-speed interconnection vias, the graphic calculation unit 22 desirably instructs the display unit 23 to display a screen prompting the user to correct the GND conductive areas in the periphery of the high-speed interconnection vias and make additional arrangement of the GND vias. In this way, the user can recognize the GND conductive areas which need to be corrected in the periphery of the high-speed interconnection vias.

Figure 19:
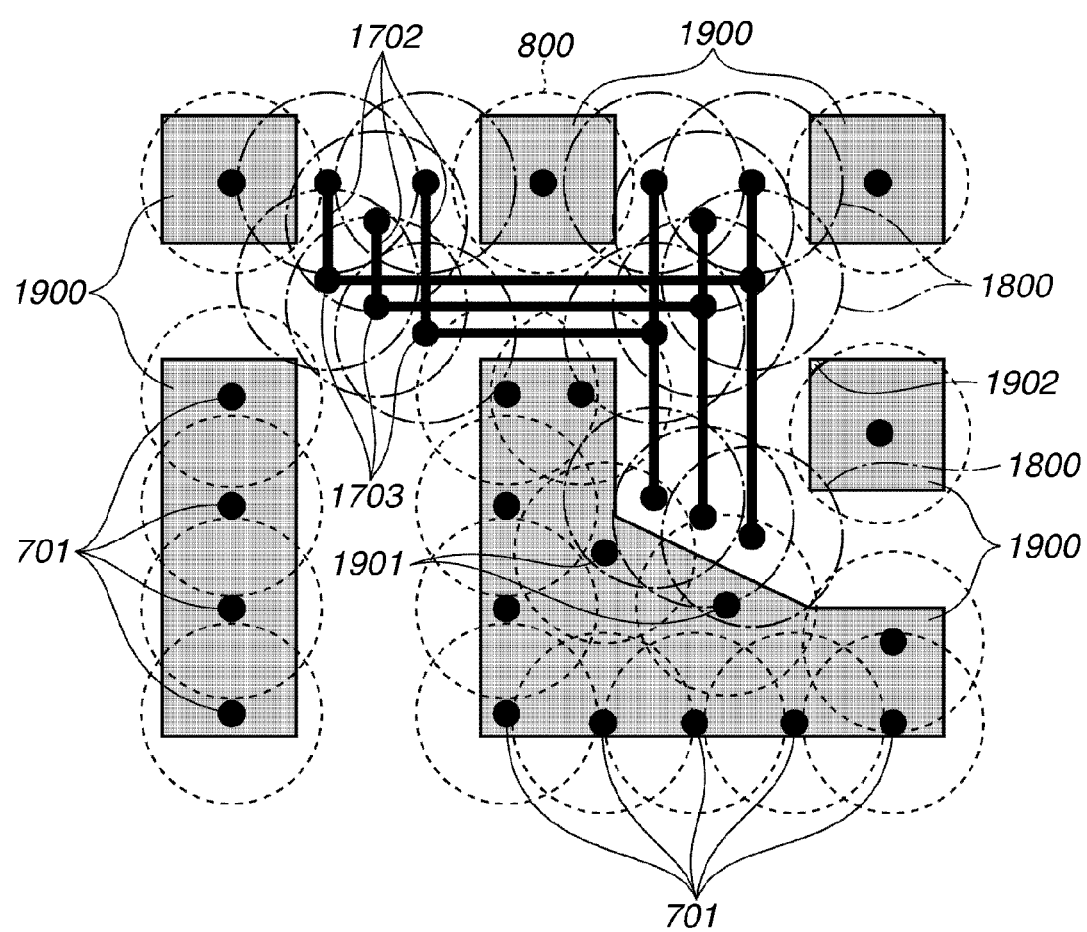
FIG. 19 illustrates a result of re-verification after a GND via is appropriately added according to the third exemplary embodiment of the present invention.

When the above-described screen is displayed, the user can give priority consideration and add the GND via to the additional-GND-via priority area 1801 in the additional-GND-via necessary areas 1802. If verification is performed after the GND via is appropriately arranged, the additional-GND-via necessary areas 1802 substantially do not exist after the process in step S1604 as illustrated in FIG. 19, and the entire GND overlap conductive areas 600 are substantially changed to the additional-GND-via unnecessary areas 1900. In FIG.

19, two GND vias 1901 are added. It is to be noted that the GND vias are not necessarily added so that all of the additional-GND-via necessary areas 1802 are changed to the additional-GND-via unnecessary areas 801. For example, if an additional-GND-via necessary area 1902 is too small to add an additional GND via as illustrated in FIG. 19, then a GND via does not need to be added.

Further, similar to the first exemplary embodiment, the user does not necessarily add or move the GND via to the additional-GND-via necessary areas 1802. The GND conductive areas can be deleted in a permissible range from a viewpoint of prevention of radiation noise.

Further, if high-speed interconnection vias which do not have the GND overlap conductive areas 600 within the area which corresponds to the maximum allowable high-speed interconnection via-GND via interval L2 are displayed from among the high-speed interconnection vias to be distinguishable, then the GND conductive areas in the periphery of the high-speed interconnection vias can be corrected and GND vias can be added.

According to the third exemplary embodiment, the user can easily recognize the additional-GND-via priority area 1801 as well as the additional-GND-via necessary areas 1802 to which the GND via can be added. Accordingly, the user can arrange an additional GND via which enables shortening a path of a return current of a high-speed interconnection without taking time and without omission.

It is to be noted that not only the GND conductive areas but also power areas can be verified in a similar way as conductive areas where constant potential is applied. In step S1603, the area within a predetermined distance corresponding to half the maximum allowable high-speed interconnection via-GND via interval from the center of a specified high-speed interconnection via is extracted as the area C. However, a different area having a similar level can also be extracted. For example, an area of a rectangle, such as a square, whose diagonal cross (reference point) is arranged at a center of a via and whose side equals the maximum allowable interval can also be extracted.

The area within a distance corresponding to the maximum allowable high-speed interconnection via-GND via interval from a high-speed interconnection via can be set as an additional-GND-via priority area. For example, the user can enter a rate Y (%) and an area within a distance "L2×Y/100" from the high-speed interconnection via can be determined as the additional-GND-via priority area. In other words, the GND vias can be arranged at a shorter interval than L2.

Further, step S308 can be omitted and direct verification considering high-speed interconnection vias can be performed.

The above-described exemplary embodiments are implemented when a provided program is executed by a computer. Further, a unit used for providing the program to the computer such as a computer-readable recording medium including a CD-ROM in which the program is recorded, a transmission medium such as the Internet used for transmitting the program to realize the functions of the above-described exemplary embodiments, and also the above-described program configure the exemplary embodiments of the present invention. The above-described program, recording medium, transmission medium, and program product are also interpreted as the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-249748 filed Sep. 26, 2007, which is hereby incorporated by reference herein in its entirety.

What is claimed is:

1. A method for supporting design of a printed circuit board including, at least one processor, memory coupled to the at least one processor via a bus, and a plurality of conductive layers including conductive areas to which a constant potential is applied, comprising:

specifying the conductive areas for each of the plurality of conductive layers;

extracting, using the at least one processor, areas which overlap on the plurality of conductive layers, from the specified conductive areas which include a non-overlapped area on the plurality of conductive layers;

specifying an interlayer connection member that electrically connects at least two of the plurality of conductive layers in the extracted areas;

specifying signal lines for each of the plurality of conductive layers;

specifying a second interlayer connection member configured to electrically connect at least two signal lines among the specified signal lines; and specifying second areas in the extracted areas and within a predetermined distance from the specified second interlayer connection member, as the areas where the interlayer connection member is to exist, wherein the second areas are away from the first interlayer connection member.

2. The method according to claim 1, further comprising inputting the wiring from the conductive areas for each of the plurality of conductive layers.

3. The method according to claim 1, further comprising limiting the conductive areas including the wiring to conductive areas in part of a plurality of conductive layers among the plurality of conductive layers in the conductive areas.

4. The method according to claim 1, further comprising specifying another area in the extracted areas beyond the predetermined distance from the specified interlayer connection member.

5. The method according to claim 4, further comprising requesting addition of the interlayer connection member to the clearly specified area beyond the predetermined distance.

6. The method according to claim 1, further comprising requesting addition of the interlayer connection member to the specified second area in the extracted area.

7. A printed circuit board design support apparatus used for supporting designing of a printed circuit board including a plurality of conductive layers including conductive areas to which a constant potential is applied, comprising:

a specifying unit configured to specify the conductive areas;

an extracting unit configured to extract areas that overlap on the plurality of conductive layers, from the conductive areas which include a non-overlapped area on the plurality of conductive layers specified by the conductive area specifying unit;

an interlayer connection member specifying unit configured to specify an interlayer connection member that electrically connects at least two of the plurality of conductive layers in the areas extracted by the extracting unit; and a specifying unit configured to specify signal lines for each of the plurality of conductive layers, specify a second interlayer connection member configured to electrically connect at least two signal lines among the specified signal lines; and specify second areas within a predetermined distance from the second interlayer connection member specified by the interlayer connection member specifying unit and in the area extracted by the extracting unit, as the areas where the interlayer connection member is to exist, wherein the second areas are away from the first interlayer connection member.

8. A non-transitory computer-readable storage medium storing a computer-executable process, the computer-executable process causing a computer to perform operations for supporting design of a printed circuit board including a plurality of conductive layers including conductive areas to which a constant potential is applied, the operations comprising:

specifying the conductive areas for each of the plurality of conductive layers;

extracting areas which overlap on the plurality of conductive layers, from the specified conductive areas which include a non-overlapped area on the plurality of conductive layers;

specifying an interlayer connection member that electrically connects at least two of the plurality of conductive layers in the extracted areas;

specifying signal lines for each of the plurality of conductive layers;

specifying a second interlayer connection member configured to electrically connect at least two signal lines among the specified signal lines; and specifying second areas in the extracted areas and within a predetermined distance from the specified second interlayer connection member, as the areas where the interlayer connection member is to exist, wherein the second areas are away from the first interlayer connection member.

* * * * *